(12) United States Patent
Tabatabaie et al.

(10) Patent No.: US 7,692,222 B2
(45) Date of Patent: Apr. 6, 2010

(54) ATOMIC LAYER DEPOSITION IN THE FORMATION OF GATE STRUCTURES FOR III-V SEMICONDUCTOR

(75) Inventors: Kamal Tabatabaie, Sharon, MA (US); Robert B. Hallock, Newton, NH (US)

(73) Assignee: Raytheon Company, Waltham, MA (US)

(*) Notice: Subject to any disclaimer, the term of this patent is extended or adjusted under 35 U.S.C. 154(b) by 128 days.

(21) Appl. No.: 11/557,354

(22) Filed: Nov. 7, 2006

(65) Prior Publication Data

US 2008/0105901 A1 May 8, 2008

(51) Int. Cl.
*H01L 29/47* (2006.01)

(52) U.S. Cl. .......................... 257/284; 257/73; 257/155; 257/260; 257/267; 257/280; 257/281; 257/472; 257/217; 257/E31.074; 257/E27.068; 257/E27.131; 257/E27.152; 257/E29.041; 257/E29.067; 257/E29.122; 257/E29.34; 257/E21.186; 257/E21.45; 257/E29.321; 257/E21.455; 257/E21.458; 257/E21.621; 257/E21.158; 257/E29.246; 257/24; 257/192; 257/194; 257/E29.249; 438/579

(58) Field of Classification Search ................. 438/579
See application file for complete search history.

(56) References Cited

U.S. PATENT DOCUMENTS

| 4,337,115 | A | * | 6/1982 | Ikeda et al. ................. 438/670 |
| 5,879,459 | A | | 3/1999 | Gadgil et al. |
| 5,981,319 | A | * | 11/1999 | Lothian et al. .............. 438/167 |
| 6,042,652 | A | | 3/2000 | Hyun et al. |
| 6,117,741 | A | * | 9/2000 | Chatterjee et al. ........... 438/299 |
| 6,143,659 | A | | 11/2000 | Leem |
| 6,174,377 | B1 | | 1/2001 | Doering et al. |

(Continued)

FOREIGN PATENT DOCUMENTS

JP 53 065671 A 6/1978

OTHER PUBLICATIONS

K. Tabatabaie-Alavi, D.M. Shaw, P.J. Duval, Evolution of T-Shaped Gate Lithography for Compound Semiconductors Field Effect Transistors, IEEE Transaction on Semiconductor Manufacturing, Aug. 2003, pp. 365-369.

(Continued)

*Primary Examiner*—Minh-Loan T Tran
*Assistant Examiner*—Fei Fei Yeung Lopez
(74) *Attorney, Agent, or Firm*—Daly, Crowley, Mofford & Durkee, LLP

(57) ABSTRACT

A semiconductor structure and method wherein a recess is disposed in a surface portion of a semiconductor structure and a dielectric film is disposed on and in contract with the semiconductor. The dielectric film has an aperture therein. Portions of the dielectric film are disposed adjacent to the aperture and overhang underlying portions of the recess. An electric contact has first portions thereof disposed on said adjacent portions of the dielectric film, second portions disposed on said underlying portions of the recess, with portions of the dielectric film being disposed between said first portion of the electric contact and the second portions of the electric contact, and third portions of the electric contact being disposed on and in contact with a bottom portion of the recess in the semiconductor structure. The electric contact is formed by atomic layer deposition of an electrically conductive material over the dielectric film and through the aperture in such dielectric film.

10 Claims, 4 Drawing Sheets

U.S. PATENT DOCUMENTS

| | | |
|---|---|---|
| 6,174,809 B1 | 1/2001 | Kang et al. |
| 6,203,613 B1 | 3/2001 | Gates et al. |
| 6,270,572 B1 | 8/2001 | Kim et al. |
| 6,287,965 B1 | 9/2001 | Kang et al. |
| 6,387,185 B2 | 5/2002 | Doering et al. |
| 6,391,803 B1 | 5/2002 | Kim et al. |
| 6,399,491 B2 | 6/2002 | Jeon et al. |
| 6,416,822 B1 | 7/2002 | Chiang et al. |
| 6,420,279 B1 | 7/2002 | Ono et al. |
| 6,428,859 B1 | 8/2002 | Chiang et al. |
| 6,451,119 B2 | 9/2002 | Sneh et al. |
| 6,461,436 B1 | 10/2002 | Campbell et al. |
| 6,468,924 B2 | 10/2002 | Lee et al. |
| 6,479,902 B1 | 11/2002 | Lopatin et al. |
| 6,503,330 B1 | 1/2003 | Sneh et al. |
| 6,511,867 B2 | 1/2003 | Lowrey et al. |
| 6,527,855 B2 | 3/2003 | DelaRosa et al. |
| 6,528,430 B2 | 3/2003 | Kwan et al. |
| 6,540,838 B2 | 4/2003 | Sneh et al. |
| 6,551,399 B1 | 4/2003 | Sneh et al. |
| 6,551,893 B1 | 4/2003 | Zheng et al. |
| 6,551,929 B1 | 4/2003 | Kori et al. |
| 6,569,501 B2 | 5/2003 | Chiang et al. |
| 6,573,184 B2 | 6/2003 | Park |
| 6,576,053 B1 | 6/2003 | Kim et al. |
| 6,579,372 B2 | 6/2003 | Park |
| 6,585,823 B1 | 7/2003 | Van Wijck |
| 6,617,173 B1 | 9/2003 | Sneh |
| 6,620,670 B2 | 9/2003 | Song et al. |
| 6,630,201 B2 | 10/2003 | Chiang et al. |
| 6,634,314 B2 | 10/2003 | Hwang et al. |
| 6,638,859 B2 | 10/2003 | Sneh et al. |
| 6,638,879 B2 | 10/2003 | Hsieh et al. |
| 6,656,282 B2 | 12/2003 | Kim et al. |
| 6,656,835 B2 * | 12/2003 | Marsh et al. ............... 438/650 |
| 6,656,835 B2 * | 12/2003 | Marsh et al. |
| 6,669,990 B2 | 12/2003 | Min et al. |
| 6,673,701 B1 | 1/2004 | Marsh et al. |
| 6,716,284 B2 | 4/2004 | Campbell et al. |
| 6,716,693 B1 | 4/2004 | Chan et al. |
| 6,718,126 B2 | 4/2004 | Lei |
| 6,720,259 B2 | 4/2004 | Londergan et al. |
| 6,723,595 B2 | 4/2004 | Park |
| 6,723,642 B1 | 4/2004 | Lim et al. |
| 6,730,163 B2 | 5/2004 | Vaartstra |
| 6,730,367 B2 | 5/2004 | Sandhu |
| 6,734,020 B2 | 5/2004 | Lu et al. |
| 6,752,869 B2 | 6/2004 | Lee et al. |
| 6,753,271 B2 | 6/2004 | Sarigiannis et al. |
| 6,758,911 B2 | 7/2004 | Campbell et al. |
| 6,773,507 B2 | 8/2004 | Jallepally et al. |
| 6,784,083 B1 | 8/2004 | Gealy et al. |
| 6,787,463 B2 | 9/2004 | Mardian et al. |
| 6,796,316 B2 | 9/2004 | Park |
| 6,800,134 B2 | 10/2004 | Dando et al. |
| 6,808,978 B2 | 10/2004 | Kim |
| 6,815,350 B2 | 11/2004 | Kim et al. |
| 6,818,067 B2 | 11/2004 | Doering et al. |
| 6,820,570 B2 | 11/2004 | Kilpela et al. |
| 6,821,891 B2 | 11/2004 | Chen et al. |
| 6,828,218 B2 | 12/2004 | Kim et al. |
| 6,833,310 B2 | 12/2004 | Kim et al. |
| 6,835,671 B2 | 12/2004 | Hector et al. |
| 6,844,260 B2 | 1/2005 | Sarigiannis et al. |
| 6,849,300 B2 | 2/2005 | Kil et al. |
| 6,861,334 B2 | 3/2005 | Raaijmakers et al. |
| 6,863,021 B2 | 3/2005 | Sneh |
| 6,867,101 B1 | 3/2005 | Yu |
| 6,869,876 B2 | 3/2005 | Norman et al. |
| 6,872,421 B2 | 3/2005 | Hwang et al. |
| 6,878,402 B2 | 4/2005 | Chiang et al. |
| 6,893,506 B2 | 5/2005 | Doan et al. |
| 6,896,730 B2 | 5/2005 | Derderian et al. |
| 6,897,119 B1 | 5/2005 | Sneh et al. |
| 6,902,620 B1 | 6/2005 | Omstead et al. |
| 6,905,547 B1 | 6/2005 | Londergan et al. |
| 6,905,964 B2 | 6/2005 | Lim et al. |
| 6,907,897 B2 | 6/2005 | Maula et al. |
| 6,916,374 B2 | 7/2005 | Sandhu et al. |
| 6,916,398 B2 | 7/2005 | Chen et al. |
| 6,919,578 B2 | 7/2005 | Lowrey et al. |
| 6,930,059 B2 | 8/2005 | Conley, Jr. et al. |
| 6,933,011 B2 | 8/2005 | Senzaki |
| 6,939,578 B2 | 9/2005 | Bradley et al. |
| 6,941,963 B2 | 9/2005 | Maula et al. |
| 6,943,073 B2 | 9/2005 | Marsh et al. |
| 6,943,097 B2 | 9/2005 | Cabral, Jr. et al. |
| 6,949,450 B2 | 9/2005 | Chiang et al. |
| 6,949,833 B2 | 9/2005 | O'Kane |
| 6,967,154 B2 | 11/2005 | Meng et al. |
| 6,970,053 B2 | 11/2005 | Akram et al. |
| 6,992,019 B2 | 1/2006 | Lee et al. |
| 7,018,469 B2 | 3/2006 | Li et al. |
| 7,021,330 B2 | 4/2006 | Maula et al. |
| 7,022,605 B2 | 4/2006 | Doan et al. |
| 7,030,037 B2 | 4/2006 | Doan et al. |
| 7,037,574 B2 | 5/2006 | Paranjpe et al. |
| 7,304,330 B2 * | 12/2007 | Nakagawa ............... 257/192 |
| 2004/0104443 A1 | 6/2004 | Ahn et al. |
| 2005/0127354 A1 * | 6/2005 | Hanna et al. ............... 257/40 |
| 2006/0124962 A1 | 6/2006 | Ueda et al. |
| 2007/0287256 A1 * | 12/2007 | Chang et al. ............... 438/283 |

OTHER PUBLICATIONS

D. Fanning, L. Withowski, J. Stidham, H., Q. Tseng, M. Muir and P. Saunier, Dielectrically defined optical Tee-gate for high power GaAs pHEMT, Proc. GaAs Mantech, 2002, pp. 83-86.

Notification of transmittal of the International Search Report and the Written Opinion of the International Searching Authority, or the Declaration dated May 6, 2008, Application No. PCT/US2007/022198.

Jessen G H et al: "Gate optimization of AlGaN/GaN HEMTs using Wsi, Ir, Pd, and Ni Schottky contacts", GAAS IC Symposium. 25$^{th}$. Annual IEEE Gallium Arsenide Integrated Circuit Symposium. Technical Digest 2003. GAAS IC Symposium—IEEE Gallium Arsenide Integrated Circuit Symposium, New York, NY: IEEE, US, Nov. 9, 2003, pp. 277-279, XP010673675. ISBN: 0-7803-7833-4. the whole document.

Chae J et al: "Atomic Layer deposition of nicket by the reduction of preformed nickel oxide" Electrochemical and Solid-State Letters, Electrochem. Soc USA, vol. 5, No. 6, Jun. 2002, pp. C64-C66, XP002477790. ISSN: 1099-0062. the whole document.

Zhang L C et al: "Refractory metal nitride rectifying contacts on GaAs", Journal of Vacuum Science & Technology B (Microelectronics Processing and Phenomena) USA, vol. 5, No. 6, Nov. 1987, pp. 1716-1722, XP002477791. ISN: 0734-211X. the whole document.

Notification Concerning Transmittal of International Preliminary Report on Patentability (Chapter 1 of the Patent Cooperation Treaty) and Written Opinion of the International Searching Authority, PCT/US2007/022198 dated May 22, 2009, 8 pages.

* cited by examiner

ATOMIC LAYER DEPOSITION IN THE FORMATION OF GATE STRUCTURES FOR III-V SEMICONDUCTOR

TECHNICAL FIELD

This invention relates generally to the formation of gate structures for III-V semiconductors.

BACKGROUND

As is known in the art, Atomic Layer Deposition (ALD) technique is used in the deposition of thin films of metals and dielectric in which there is precise, atomic level, control of the film thickness and conformality. This feature is due to the reaction limited chemistry of the deposition technique. The ALD method has been applied to the formation of dielectric capacitors in DRAM manufacturing and recently in the form of barrier metal nitrides, TiN and TaN, in the manufacture of Si integrated circuits (ICs) with hundreds of millions of transistors. Not every metal or dielectric can be deposited using ALD method; however. Among the metals which can be routinely produced by ALD, TiN and Ni are of particular interest to the formation of the gate region of compound semiconductors, and in particular, III-V semiconductors.

Presently, the gate of most mature III-V FETs, GaAs and InP, are fabricated using a Tee-gate structure in a double recessed device. As GaN and future semiconductor technologies, e.g., diamond mature to the manufacturing level, a double recessed structure will be employed in their fabrication. A schematic diagram of a double recessed Tee-gate structure is shown in FIG. 1 having N+/N GaAs Contact Layer 28, AlGaAs Top Confinement Layer 26, Top Si Pulse Doping (~5 Å) layer 24, InGaAs Pseudo-morphic Channel layer 22, Bottom Si Pulse Doping (~5 Å) layer 20, AlGaAs Bottom Confinement Layer 18, AlGaAs/GaAs Supper Lattice Buffer Layers 16, GaAs Buffer Layer 14, and semi-insulating GaAs substrate 12. The FET includes source and drain electrodes 30 in ohmic contact with the N+/N GaAs Contact Layer 28. The structure includes a first recess 34 formed in the N+/N GaAs Contact Layer 28. Following the formation of the first recess 34 in the semiconductor structure, as shown in FIG. 1, a thin layer or film 37 of dielectric, such as SiN is deposited over the surface of such semiconductors structure. A Tee-gate 36 is formed then through a second recess 38, such Tee-gate being in Schottky contact with the AlGaAs Top Confinement Layer 26. It is noted in FIG. 1A that there are air gaps in recess 38, such air gaps being between the semiconductor and the Tee gate 36.

The main electrical disadvantage of the Tee-gate is the significant increase in the parasitic gate to drain and gate to source capacitances upon passivation of the FETs by common dielectrics such as SiN. This problem gets progressively worse as more layers of passivation are needed for the interlayer dielectric and environmental protection of the chip. Furthermore, there are numerous processing difficulties associated with the Tee-gate fabrication in a double recessed structure as follows.

1. When a direct E-beam write method is used to form the Tee-gate, two separate E-beam resist, such as PMMA and PMAA have to be spun and written with different dose and shapes. This reduces the throughput to less than 4 wafers per hour. Furthermore, the control of the gate length and Tee-top dimensions are hard to achieve. This issue has been discussed in a paper by K. Tabatabaie-Alavi, D. M. Shaw, and P. J. Duval, "Evolution of T-Shaped Gate Lithography for Compound Semiconductors Field Effect Transistors," in IEEE Transaction on Semiconductor Manufacturing, August 2003, pp. 365-369.
2. Even when the Tee-top and stem are written separately in a hybrid Tee-gate approach, the alignment between the two resist levels and intermixing between the two resist layers have to be tightly controlled.
3. Due to the nature of the evaporated Ti/Pt/Au (GaAs, InP) or Ni/Pt/Au (GaN, AlGaN), severe crevices are formed underneath the Tee-gates which impede the coverage of the SiN passivation layer.
4. When a dielectric is used for the transfer of the stem pattern in a hybrid gate approach (see D. Fanning, L. Withowski, J. Stidham, H.-Q. Tseng, M. Muir, and P. Saunier, "Dielectrically defined optical Tee-gate for high power GaAs pHEMT," in Proc. GaAs MANTECH, 2002, pp. 83-86), the etching of the dielectric and the subsequent semiconductor (gate recess) become extremely critical because any excessive amount of etch undercut or damage could severely impact device performance and long term stability.

SUMMARY

In accordance with the present invention, a semiconductor body is provided having a semiconductor structure; a recess disposed in a surface portion of the semiconductor structure; and a dielectric film disposed on and in contract with the semiconductor. The dielectric film has an aperture therein. Portions of the dielectric film are disposed adjacent to the aperture and overhang underlying portions of the recess. An electric contact has first portions thereof disposed on said adjacent portions of the dielectric film, second portions disposed on said underlying portions of the recess, with portions of the dielectric film being disposed between said first portion of the electric contact and the second portions of the electric contact, and third portions of the electric contact being disposed on and in contact with a bottom portion of the recess in the semiconductor structure.

In one embodiment, the electric contact is formed by atomic layer deposition (ALD).

In one embodiment, the electric contact is TiN when forming GaAs/AlGaAs, InP, InGaAs/InAlAs pHEMTs or Ni when forming GaN, AlGaN, Diamond HEMT).

In one embodiment, the electric contact is formed as Schottky contact film.

In one embodiment, the thickness of the electric contact is in the range from 5 nm to 100 nm.

With such structure, the air gaps in recess 38 shown in FIG. 1B have been removed by decoupling of the gate patterning and etch processes from the Tee-gate formation. Firstly, there is no need for the complicated steps of forming Tee-gate resist profile either in all E-beam or a combination of E-beam and optical process. Secondly, the ALD deposition removes the intrinsic problem inherent with the method of Fanning et.-al, in which air pockets exist.

In one embodiment, the electric contact is in Schottky contact with the bottom portion of the recess in the semiconductor structure.

In accordance with another feature of the invention, a method is provided for forming a semiconductor body. The method includes: forming a dielectric film on and in contract with a semiconductor structure; forming an aperture in a portion of the dielectric film, such aperture exposing an underlying portion of the semiconductor structure with portions of the dielectric film remaining disposed adjacent to the aperture and overhanging underlying portions of the recess;

and forming an electric contact with first portions thereof disposed on said adjacent portions of the dielectric film, second portions disposed on said underlying portions of the recess, with portions of the dielectric film being disposed between said first portion of the electric contact and the second portions of the electric contact, and third portions of the electric contact being disposed on and in contact with a bottom portion of the recess in the semiconductor structure.

In one embodiment, the electric contact forming comprises atomic layer deposition of an electrically conductive material over the dielectric film and through the aperture in such dielectric film.

In one embodiment, the electrically conductive material is nitride or a compound of nitride.

In one embodiment, the electrically conductive material is a film having a thickness in the range from 5 nm to 100 nm.

In one embodiment, the electric contact is formed in Schottky contact with the bottom portion of the recess in the semiconductor structure.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 2A:
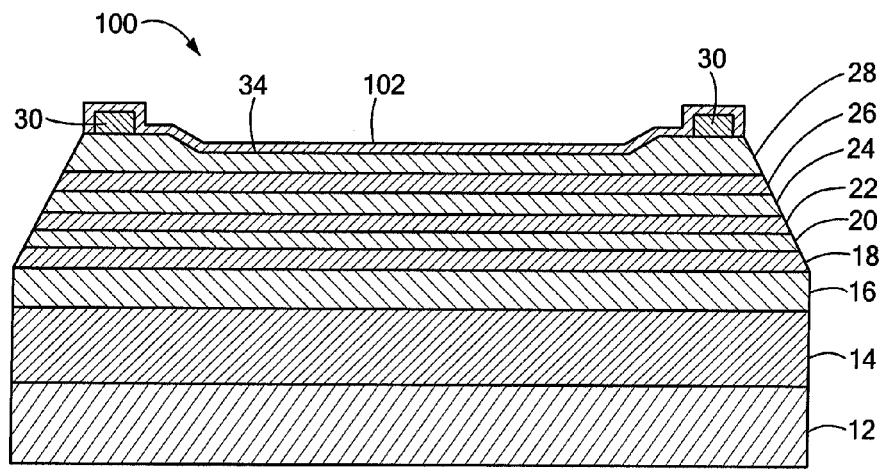
FIGS. 2A-2D are cross-sectional diagrammatic sketches of a double recessed Tee-gate structure at various stages in the fabrication thereof in accordance with the invention.

Referring now to FIGS. 2A-2D, a selective first recess is formed in a GaAs, InP, GaN HEMT/pHEMT, semiconductor structure 100 followed by deposition of a thin layer or film 102 of dielectric, such as SiN over the surface of such semiconductors structure 100 (FIG. 2A). Thus, here again the semiconductor structure 100 includes N+/N GaAs Contact Layer 28, AlGaAs Top Confinement Layer 26, Top Si Pulse Doping (~5 Å) layer 24, InGaAs Pseudo-morphic Channel layer 22, Bottom Si Pulse Doping (~5 Å) layer 20, AlGaAs Bottom Confinement Layer 18, AlGaAs/GaAs Supper, Lattice Buffer Layers 16, GaAs Buffer Layer 14, and semi-insulating GaAs substrate 12. Source and drain electrodes 30 are in ohmic contact with the N+/N GaAs Contact Layer 28. The semiconductor structure 100 includes a first recess 34 formed in the N+/N GaAs Contact Layer 28. Here, however, after forming the first recess 34, the thin layer or film 102 of dielectric, such as SiN over the surface of the semiconductor structure 100 (FIG. 2A) including over the source and drain contacts 30. This thin SiN or other suitable dielectrics such as $SiO_2$, SiON, $Al_2O_3$ etc. can range in thickness from 20 nm to 200 nm depending on the actual device and material design.

Figure 2B:
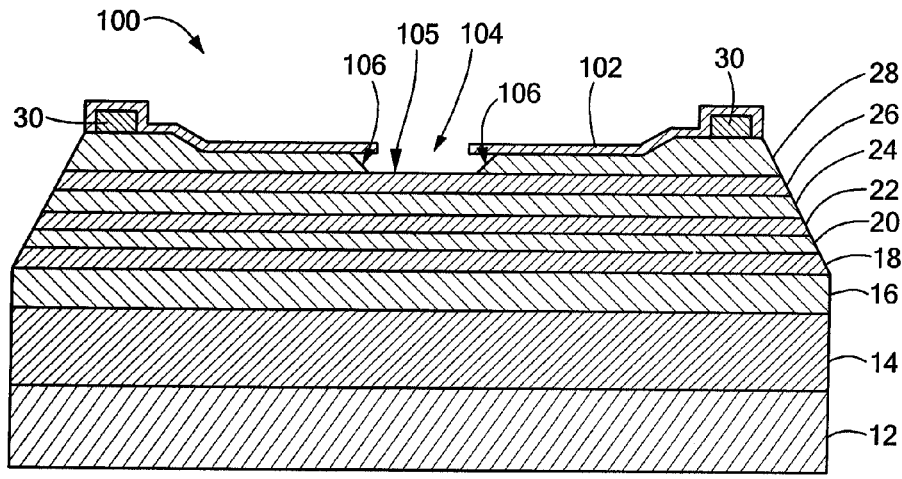

Next this dielectric layer or film 102 is selectively etched (FIG. 2B) using standard low damage dry etch processing techniques. This step is followed by wet or dry gate to form a recess 105 having a desired depth, again following established wet/dry etch processing methods. FIG. 2B illustrates the structure cross sectional view at this stage of the processing. Thus, the dielectric film 102 is disposed on and in contract with the semiconductor structure 100, such dielectric film 100 having an aperture 104 therein, portions of the dielectric 102 film being disposed adjacent to the aperture 104 and overhanging underlying portions 106 of recess 105. Thus, the process forms the aperture 104 in a portion of the dielectric film 102, such aperture 104 exposing an underlying portion of the semiconductor structure 100 with portions of the dielectric film 102 remaining disposed adjacent to the aperture 104 and overhanging underlying portions of the recess 105.

Figure 1:
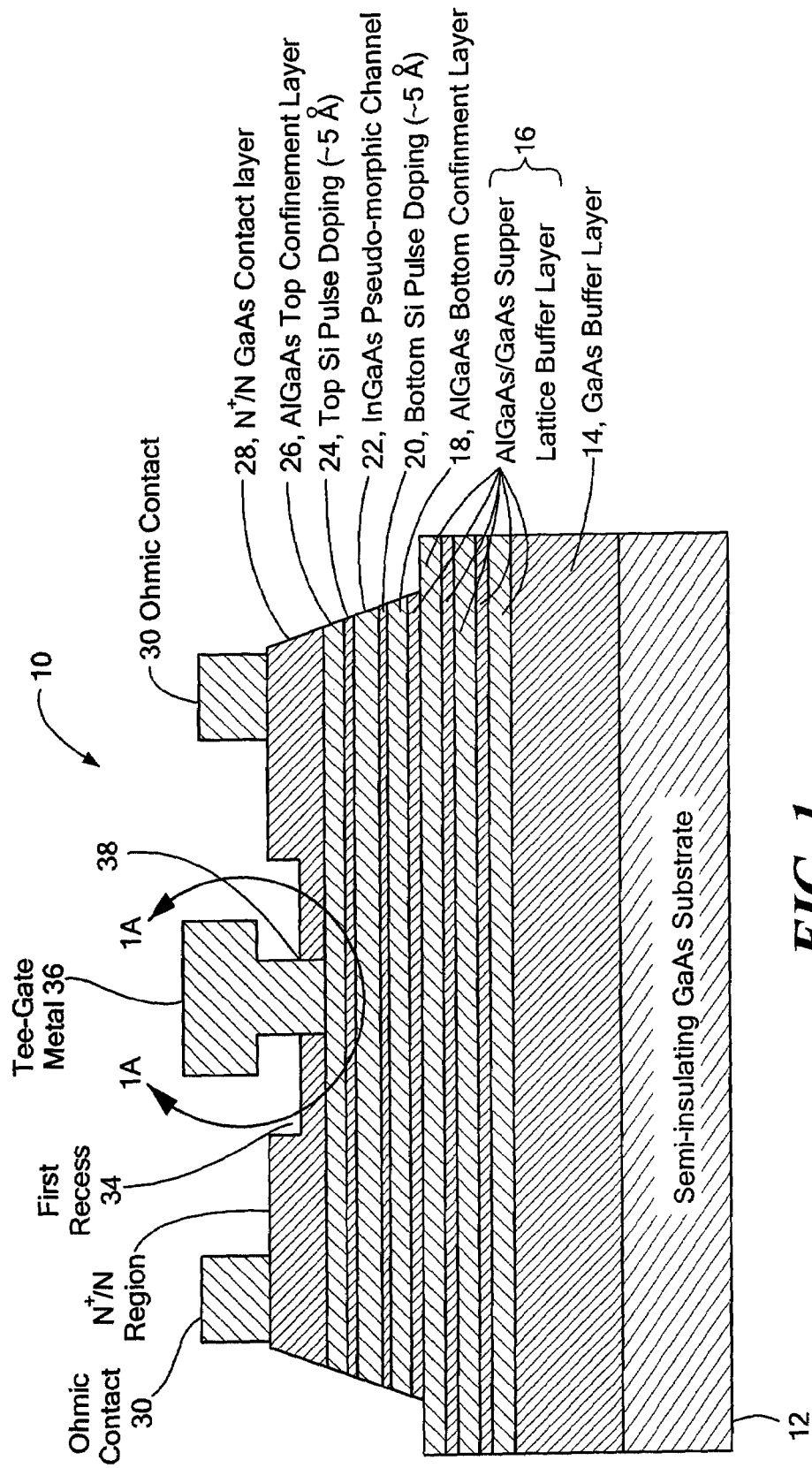
FIG. 1 is a schematic cross-sectional diagrammatic sketch of a double recessed Tee-gate structure according to the PRIOR ART.
Figure 1A:
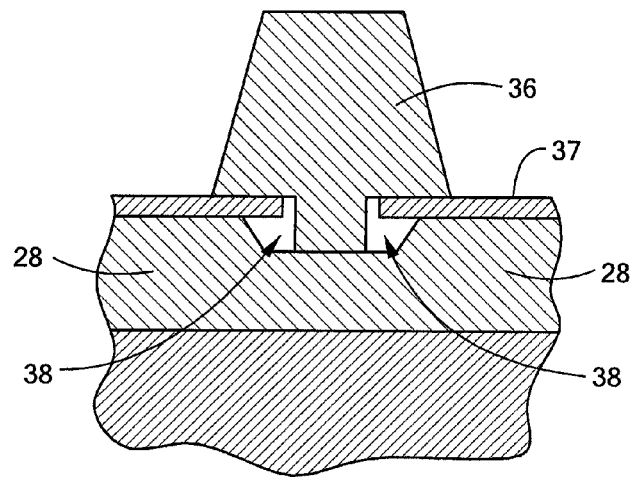
FIG. 1A is an enlarged portion of the structure of FIG. 1, such portion being encircled by the arrow 1A-1A in FIG. 1.
Figure 2C:
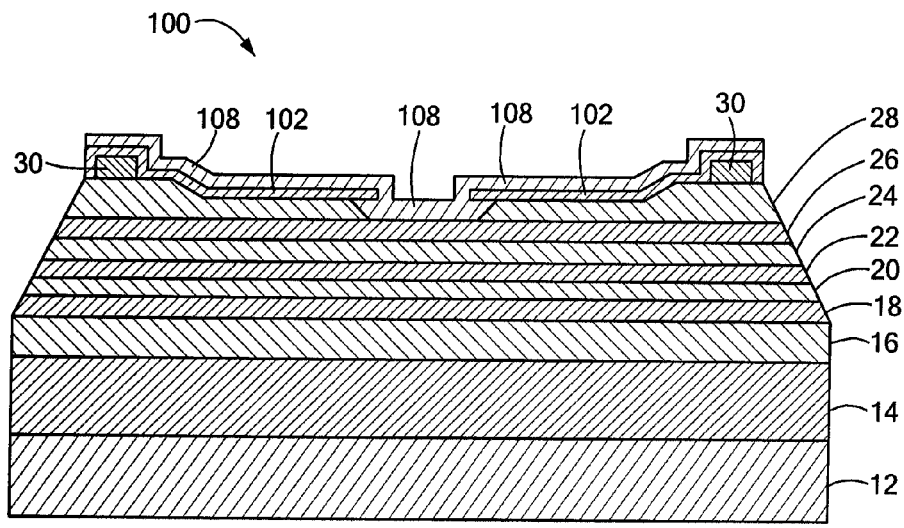

Next, ALD of TiN (when forming GaAs/AlGaAs, InP, InGaAs/InAlAs pHEMTs) or Ni (when forming GaN, AlGaN, Diamond HEMT) is formed as Schottky contact film 108 over the entire structure 100, FIG. 2C. The thickness of the ALD film 108 can range from 5 nm to 100 nm depending on the application. It must be noted that TiN forms very stable Schottky diode contact to the GaAs, AlGaAs, or InAlAs materials which are used as the Schottky layer of pHEMTs. Furthermore, TiN is stable in ambient and does not corrode. The same is true for Ni Schottky contact on GaN, and AlGaN. The main advantage of the ALD film is the conformal coverage of the entire surface. This leaves no ungated recess or regions of the gate which are not covered by the Schottky metal. The wafer cross sectional view at this step of the process is shown in FIG. 2C. With such structure, the air gaps in region 38 shown in FIG. 1A has been removed. Thus, an electric contact, here a gate contact, 108 is formed having first portions 108a thereof disposed on said adjacent portions of the dielectric film 102, second portions 108b disposed on said underlying portions of the recess 105, with portions of the dielectric film 102 being disposed between said first portion 108a of the electric contact 108 and the second portions 108b of the electric contact 108, and third portions 108c of the electric contact 108 being disposed on and in contact with a bottom portion 109 of the recess 105 in the semiconductor structure 100.

Figure 2D:
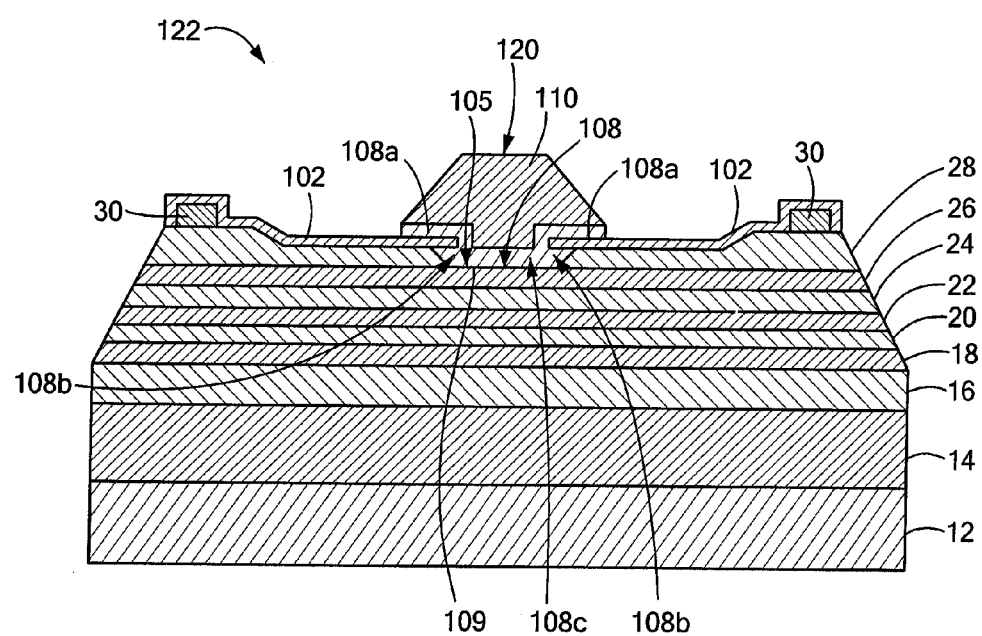

Following the ALD film 108 deposition step, a Ti/Au top metal 110 is formed by the standard liftoff lithographic techniques (FIG. 2D). The top metal 110 is aligned to the gate and the overlap on both drain and source contacts 30 sides can be controlled by the layout design. Therefore, both symmetric and so-called gamma gate devices can be formed. Furthermore, both gate connected and source connected field plates can be made simultaneously using this technique.

In the final step of gate formation process, the Au metal is used as a self-aligned mask to etch TiN or Ni. TiN 108 can be etched by dry etching techniques while leaving the SiN as the etch stop or the material to be used to buffer the damage due to the etching of TiN. Ni can be etched in a dilute solution of HCl. The cross sectional view of the device after this processing step is shown in FIG. 2D. This method of gate formation does not create any crevices underneath the Tee-gate 120 and has all the advantages of the conventional Tee-gates while avoiding the drawbacks. Following the gate formation, standard MMIC manufacturing processes is followed such as multiple steps of dielectric passivation. The contribution of subsequent dielectric film depositions to the gate to source and gate to drain parasitic capacitances are reduced as compared to the case of conventional Tee-gates.

Thus, as shown in FIG. 2D, a field effect transistor structure 122 is formed. The structure includes: a semiconductor structure 100; a recess 105 disposed in a surface portion of the semiconductor structure 100; a dielectric film 102 disposed on and in contract with the semiconductor structure 100, such dielectric film 102 having an aperture 104 therein, portions of the dielectric film 102 being disposed adjacent to the aperture 104 and overhanging underlying portions of the recess 105; and a gate electrode structure 120 having first portions 108a thereof disposed on said adjacent portions of the dielectric film 102, second portions 108b disposed on said underlying portions of the recess 105, with portions of the dielectric film 102 being disposed between said first portion 108a of the electric contact 108 and the second portions 108b of the electric contact 108, and third portions 108c of the electric contact 108 being disposed on and in Schottky contact with the bottom portion 109 of the recess 105 in the semiconductor structure 100.

A number of embodiments of the invention have been described. Nevertheless, it will be understood that various modifications may be made without departing from the spirit and scope of the invention. Accordingly, other embodiments are within the scope of the following claims.

What is claimed is:

1. A semiconductor body comprising:
    a structure of semiconductor material, said material having a recess disposed in a surface portion of the semiconductor material, first portions of the semiconductor material providing sidewalls of the recess, second portions of said semiconductor material providing a bottom of the recess;
    a dielectric film disposed on and in contract with the semiconductor material, such dielectric film having an aperture therein, first portions of the dielectric film being disposed adjacent to the aperture and second portions of the dielectric film overhanging the sidewalls of the recess;
    an electric contact having: first portions disposed on said first portions of the dielectric film; second portions disposed on and in contact with said first portions of the semiconductor material providing the sidewalls of the recess; and third portions disposed on and in contact with second portions of said semiconductor material providing a bottom of the recess.

2. The semiconductor body recited in claim 1 wherein the electric contact is in Schottky contact with the bottom of the recess in the semiconductor material.

3. The semiconductor body recited in claim 1 wherein the electric contact is an atomic layer deposition (ALD) film.

4. The semiconductor body recited in claim 3 wherein the electric contact is TiN when forming a Schottky gate contact to: GaAs/AlGaAs; InP; or InGaAs/InAlAs pHEMTs; or, Ni when forming a Schottky gate contact to: GaN; AlGaN; or Diamond HEMTs.

5. The semiconductor body recited in claim 4 wherein the electric contact is formed as Schottky contact film.

6. The semiconductor body recited in claim 5 wherein the thickness of the electric contact is in the range from 5 nm to 100 nm.

7. A field effect transistor structure comprising:
    a structure of semiconductor material, said material having a recess disposed in a surface portion of the semiconductor material, first portions of the semiconductor material providing sidewalls of the recess, second portions of said semiconductor material providing a bottom of the recess;
    a dielectric film disposed on and in contract with the semiconductor material, such dielectric film having an aperture therein, first portions of the dielectric film being disposed adjacent to the aperture and second portions of the dielectric film overhanging the sidewalls of the recess;
    a gate electrode structure having: first portions disposed on said first portions of the dielectric film; second portions disposed on and in contact with said first portions of the semiconductor material providing the sidewalls of the recess; and third portions with portions disposed on and in Schottky contact with the bottom of the recess.

8. The semiconductor structure recited in claim 1 wherein the electrical contact is nitride or a compound of nitride.

9. The semiconductor structure recited in claim 8 wherein the electrical contact is a film having a thickness in the range from 5 nm to 100 nm.

10. The semiconductor structure recited in claim 9 wherein the electric contact is formed in Schottky contact with the bottom of the recess in the semiconductor structure.

* * * * *

UNITED STATES PATENT AND TRADEMARK OFFICE
CERTIFICATE OF CORRECTION

PATENT NO. : 7,692,222 B2 Page 1 of 1
APPLICATION NO. : 11/557354
DATED : April 6, 2010
INVENTOR(S) : Tabatabaie et al.

It is certified that error appears in the above-identified patent and that said Letters Patent is hereby corrected as shown below:

Col. 1, line 20-21, delete "using ALD" and replace with --using the ALD--.

Col. 1, line 44, delete "semiconductors structure." and replace with --semiconductor structure.--.

Col. 1, line 60, delete "resist," and replace with --resists--.

Col. 1, line 62, delete "dose" and replace with --doses--.

Col. 2, line 14, delete "H.-Q." and replace with --H. Q.--.

Col. 2, line 44, delete "HEMT)" and replace with --HEMT--

Col. 2, line 55, delete "et.-al" and replace with --et al--

Col. 3, line 55, delete "portion" and replace with --portions--

Col. 3, line 45-46, delete "semiconductors structure 100" and replace with --semiconductor structure 100--.

Col. 3, line 57, delete "SiN over" and replace with --SiN is disposed over--.

Col. 4, line 28, delete "has" and replace with --have--.

Col. 4, line 33, delete "portion" and replace with --portions--.

Col. 4, line 47, delete "of gate" and replace with --of the gate--.

Col. 4, line 57, delete "is" and replace with --are--.

Col. 4, line 66, delete "contract" and replace with --contact--.

Col. 5, line 26, delete "contract" and replace with --contact--.

Col. 6, line 5, delete "or," and replace with --or--.

Col. 6, line 30, delete "third portions with portions" and replace with --third portions--.

Signed and Sealed this

Twentieth Day of July, 2010

David J. Kappos
*Director of the United States Patent and Trademark Office*